(12) United States Patent
Carlson et al.

(10) Patent No.: US 8,101,927 B2
(45) Date of Patent: Jan. 24, 2012

(54) MASKING APPARATUS FOR AN ION IMPLANTER

(75) Inventors: Charles T. Carlson, Cedar Park, TX (US); William T. Weaver, Austin, TX (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 160 days.

(21) Appl. No.: 12/775,728

(22) Filed: May 7, 2010

(65) Prior Publication Data

US 2010/0308236 A1    Dec. 9, 2010

Related U.S. Application Data

(60) Provisional application No. 61/185,028, filed on Jun. 8, 2009.

(51) Int. Cl.
*H01J 37/317* (2006.01)
*H01J 1/54* (2006.01)
*A61N 5/00* (2006.01)

(52) U.S. Cl. ............. 250/492.21; 250/492.3; 250/492.2; 438/510; 257/E21.042; 257/E21.043

(58) Field of Classification Search ............... 250/492.1, 250/492.2, 492.21, 492.3, 505.1; 438/510, 438/514; 257/E21.04, E21.042, E21.043
See application file for complete search history.

(56) References Cited

U.S. PATENT DOCUMENTS

| | | | |
|---|---|---|---|
| 4,327,292 A * | 4/1982 | Wang et al. | 250/491.1 |
| 4,431,923 A * | 2/1984 | Wang et al. | 250/491.1 |
| 4,668,174 A | 5/1987 | Williams | |
| 6,930,316 B2 | 8/2005 | Nishihashi et al. | |
| 2005/0186745 A1 | 8/2005 | Lee | |
| 2006/0258128 A1 | 11/2006 | Nunan et al. | |
| 2006/0289798 A1 | 12/2006 | Cummings et al. | |
| 2008/0087844 A1 | 4/2008 | Nunan | |
| 2008/0149856 A1 | 6/2008 | Low | |
| 2009/0098718 A1 | 4/2009 | Knaipp et al. | |
| 2010/0314559 A1* | 12/2010 | Vopat et al. | 250/492.3 |
| 2011/0027463 A1* | 2/2011 | Riordon et al. | 427/75 |
| 2011/0256698 A1* | 10/2011 | Riordon et al. | 438/529 |

* cited by examiner

*Primary Examiner* — Bernard E Souw

(57) ABSTRACT

A masking apparatus includes a mask positioned upstream of a target positioned for treatment with ions. The mask is sized relative to the target to cause a first half of the target to be treated with a selective treatment of ions through the mask and a second half of the target to be treated with a blanket treatment of ions unimpeded by the mask during a first time interval. The masking apparatus also includes a positioning mechanism to change a relative position of the mask and the target so that the second half of the target is treated with the selective treatment of ions and the first half of the target is treated with the blanket implant during a second time interval. An ion implanter having the masking apparatus is also provided.

17 Claims, 4 Drawing Sheets

MASKING APPARATUS FOR AN ION IMPLANTER

CROSS REFERENCE TO RELATED APPLICATIONS

This application claims the benefit of provisional patent application No. 61/185,028, filed Jun. 8, 2009 which is incorporated herein by reference.

FIELD

This disclosure relates to a masking apparatus and, more particularly to a masking apparatus for an ion implanter.

BACKGROUND

An ion implanter generates and directs ions towards a target for treatment. An ion implanter may include known beam line ion implanters that generate a well defined ion beam. A beam line ion implanter includes an ion source and an is extraction electrode assembly to extract a well defined ion beam from the ion source. One or more beamline components known in the art may control and modify the ion beam to obtain an ion beam with desired characteristics which is directed towards a surface of the target. The ion beam may be distributed across a surface of the target by ion beam movement, target movement, or a combination of the two. An ion implanter may also include known plasma doping ion implanters that generate plasma in a process chamber. Ions from the plasma are attracted towards a surface of a target during certain time intervals. The target is also positioned in the process chamber of the plasma doping ion implanter. For either type of ion implanter, the target may include, but not be limited to, a semiconductor substrate, a solar cell, a polymer substrate, and a flat panel.

An ion implanter may also be equipped with a mask to provide for selected treatment of the target. A conventional mask has one or more apertures and is sized relative to the target to provide a selected treatment over an entirety of the target. Hence, an application that requires a masked and non-masked ion treatment requires one treatment with the entirety of the target masked and another treatment with the entirety of the target un-masked. One drawback with a conventional ion implanter and mask is the time necessary to move the mask away from the target in between the masked and non-masked ion treatments. This additional time negatively impacts throughput performance. Another drawback is alignment of the mask with the target. Most masking applications require precise alignment of the mask to the target. Yet another drawback is the difficulty in retrofitting an existing ion implanter with such a full sized mask including an associated alignment system to align the mask with the target.

Accordingly, there is a need for an improved masking apparatus, ion implanter, and method that overcomes the above-described inadequacies and shortcomings.

SUMMARY

According to a first aspect of the disclosure a masking apparatus is provided. The masking apparatus includes a mask positioned upstream of a target, the mask is sized relative to the target to cause a first half of the target to be treated with a selective treatment of ions through the mask and a second half of the target to be treated with a blanket treatment of ions unimpeded by the mask during a first time interval. The masking apparatus also includes a positioning mechanism to change a relative position of the mask and the target so that the second half of the target is treated with the selective treatment of ions and the first half of the target is treated with the blanket implant during a second time interval.

According to another aspect of the disclosure, an ion implanter is provided. The ion implanter includes a source of ions, a mask positioned upstream of a target positioned for treatment with the ions, the mask sized relative to the target to cause a first half of the target to be treated with a selective treatment of the ions through the mask and a second half of the target to be treated with a blanket treatment of the ions unimpeded by the mask during a first time interval, and a positioning mechanism to change relative positions of the mask and the target so that the second half of the target is treated with the selective treatment of ions and the first half of the target is treated with the blanket implant during a second time interval.

According to yet another aspect of the disclosure, a method is provided. The method includes positioning a mask a distance upstream of a target, treating a first half of the target with a selective treatment of ions through the mask and a second half of the target with a blanket treatment of ions unimpeded by the mask during a first time interval, changing a relative position of the mask and the target, and treating the second half of the target with the selective treatment of ions and the first half of the target with the blanket treatment of ions during a second time interval.

The present disclosure will now be described in more detail with reference to exemplary embodiments as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

For a better understanding of the present disclosure, reference is made to the accompanying drawings, in which like elements are referenced with like numerals, and in which.

DETAILED DESCRIPTION

Figure 1:
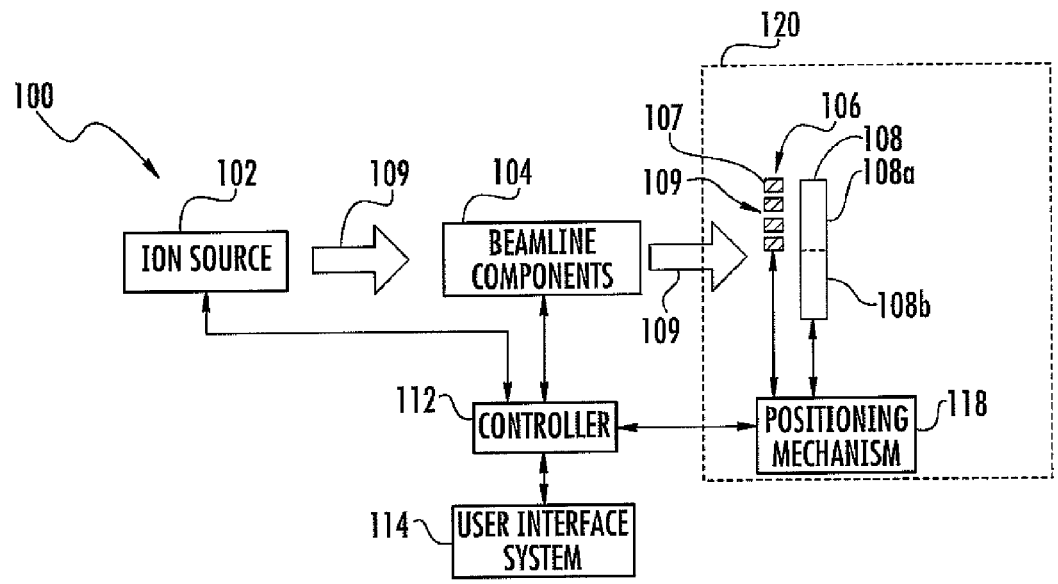
FIG. 1 is a block diagram of a beam line ion implanter having a mask and target that can be positioned relative to each other in accordance with an embodiment of the disclosure.

FIG. 1 is a block diagram of a beam line ion implanter 100 having a masking apparatus 120 consistent with an embodiment of the disclosure. The beam line implanter 100 may include an ion source 102, beamline components 104, a platen 110 to support the target 108, a controller 112, and a user interface system 114. The ion source 102 may be an indirectly heated cathode (IHC) source or any other type of source known to those skilled in the art to generate plasma from an input feed gas. An extraction electrode assembly (not illustrated) is biased to extract ions from an aperture of the ion source 102 into a well defined ion beam 109. Differing beamline components 104 known in the art may control and modify the ion beam 109 as it travels towards a front surface of the target 108. The ion beam 109 may be a spot beam or ribbon beam and the ion beam 109 may be distributed across the front surface of the target 108 by ion beam movement, target movement, or a combination of the two.

The controller 112 can be or include a general-purpose computer or network of general-purpose computers that may be programmed to perform desired input/output functions. The controller 112 also includes communication devices, data storage devices, and software. The user interface system 114 may include devices such as touch screens, keyboards, user pointing devices, displays, printers, etc. to allow a user to input commands and/or data and/or to monitor the beam line ion implanter 100 via the controller. The controller 112 may receive signals from the user interface system 114 and/or one or more components or sensors of the beam line ion implanter 100. The controller 112 may control components of the beam line ion implanter 100 in response thereto.

The masking apparatus 120 includes a mask 106 positioned upstream of a target 108. The mask 106 and the target 108 may be positioned in a process chamber of the beam line ion implanter. One or more vacuum pumps and exhaust valves may establish a vacuum condition within the process chamber as known by those skilled in the art. The mask 106 may include a blocking portion 107 that blocks ions of the ion beam 109 from striking a front surface of the target 108. The blocking portion 107 may define one or more aperture 109 that allow portions of ions from the ion beam 109 to pass there through. Advantageously, the mask 106 is sized relative to the target 108 to cause a first half 108a of the target 108 to be treated with a selective treatment of ions through the mask and a second half 108b of the target to be treated with a blanket treatment of ions unimpeded by the mask 106 during a first time interval. As such, the mask 106 and other mask embodiments may be referred to herein as a "half mask." The masking apparatus 120 may also include a positioning mechanism 118 to change a relative position of the mask 106 and the target 108 so that the second half 108b of the target is treated with the selective treatment and the first half 108a is treated with the blanket implant during a second time interval.

In one embodiment, the mask 106 may be fixed and the positioning mechanism 118 may include a rotating platen configured to support the target 108 and rotate the same 180° in between the first and second time interval while the mask 106 remains fixed to a portion of the rotating platen. In another embodiment, the target 108 may remain in a fixed position and the positioning mechanism 118 may include a retaining mechanism to support and rotate the mask 106. The retaining mechanism may include one or more fasteners to secure the mask and an actuator to rotate the mask 180° in between the first and second time interval while the target 108 remains in a fixed position. The positioning mechanism 118 may be controlled by the controller 112 and may provide positioning data to the same.

Figure 2:
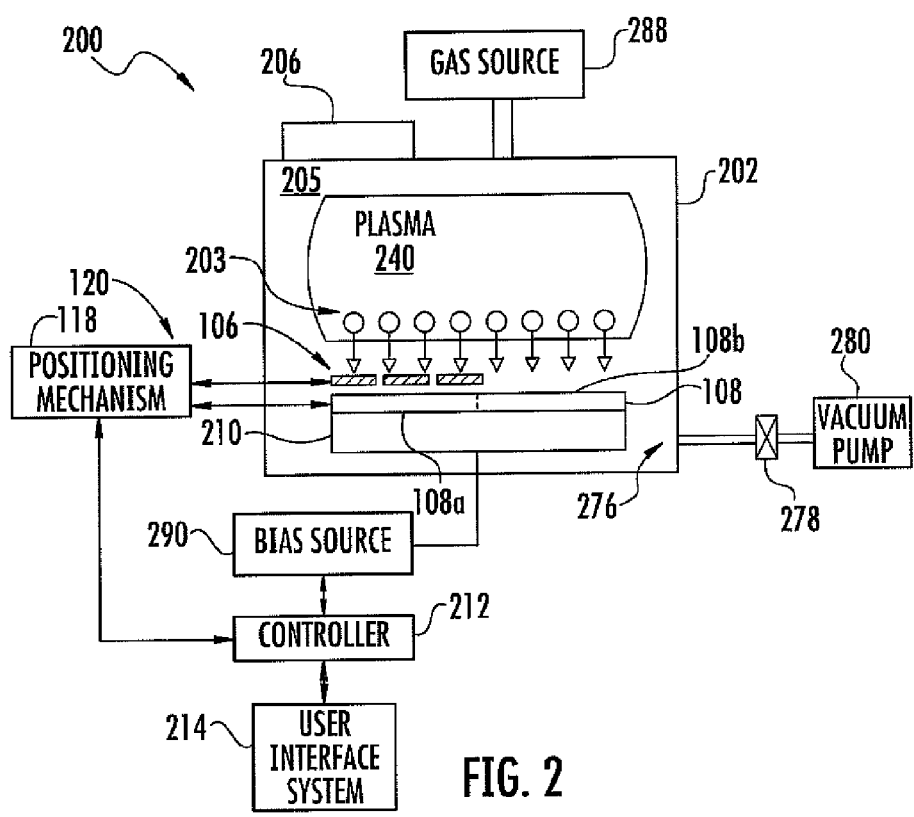
FIG. 2 is a block diagram of a plasma doping ion implanter having a mask and target that can be positioned relative to each other in accordance with an embodiment of the disclosure.

Turning to FIG. 2, a block diagram of a plasma doping ion implanter 200 that can also include a masking apparatus 120 consistent with an embodiment of the disclosure is illustrated. The masking apparatus 120 may include similar components and operates similarly to that detailed with respect to FIG. 1. For instance, the masking apparatus 120 includes the half mask 106 positioned upstream of the target 108 and the positioning mechanism 118 to change the relative position of the mask and target. In one embodiment, the positioning mechanism may be the platen 210 which is configured to support the target and rotate while the mask 106 remains in a fixed position.

The plasma doping ion implanter 200 is illustrated as a stand alone system in FIG. 2, but alternatively may be part of a cluster tool including other processing apparatuses. The plasma doping ion implanter 200 may also include a process chamber 202, a gas source 288, a vacuum pump 280, a plasma source 206, a bias source 290, a platen 210, a controller 212, and a user interface system 214. The gas source 288 provides a gas to an enclosed volume 205 of the process chamber 202. The vacuum pump 280 evacuates the process chamber 202 through the exhaust port 276 to create a high vacuum condition within the process chamber 202. The vacuum pump 280 may include a turbo pump, and/or a mechanical pump. An exhaust valve 278 controls the exhaust conductance through the exhaust port 276.

The plasma source 206 is configured to generate a plasma 240 in the process chamber 202. The plasma source 206 may be any plasma source known to those in the art such as an inductively coupled plasma (ICP) source, a capacitively coupled plasma (CCP) source, a microwave (MW) source, a glow-discharge (GD) source, a helicon source, or a combination thereof.

The bias source 290 provides a bias signal to platen 210 and the target 108 supported thereby. The bias source 290 may be a DC power supply to supply a DC bias signal or an RF power supply to supply an RF bias signal depending on the type of plasma source 206. In one embodiment, the DC bias signal is a pulsed DC bias signal with ON and OFF periods to accelerate ions 203 from the plasma 240 to the target 108 during the ON periods. Controlling the duty cycle and amplitude of such a pulsed DC bias signal can influence the dose and energy of the ions 203. The plasma doping apparatus may also include a controller 212 and a user interface system 214 of similar structure to those detailed with respect to FIG. 1. For clarity of illustration, the controller 212 is illustrated as communicating only with the bias source 290, the positioning mechanism 118, and user interface system 214. However, the controller 212 may receive input signals and provide output control signals to other components of the plasma doping ion implanter 200. In some instances, the controller 212 may receive input signals from the user interface system 214 and/or one or more other components of the implanter 200 and control components such as the positioning mechanism 118 that controls the relative positioning of the mask 106 and target 108 in response thereto.

Figure 3:
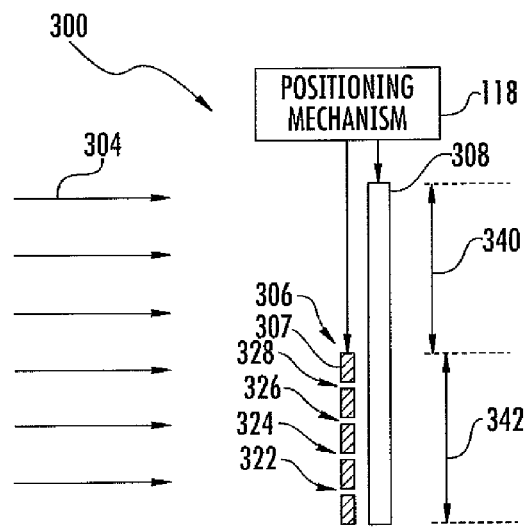
FIG. 3 is a cross sectional view of a masking apparatus consistent with an embodiment of the disclosure.
Figure 4:
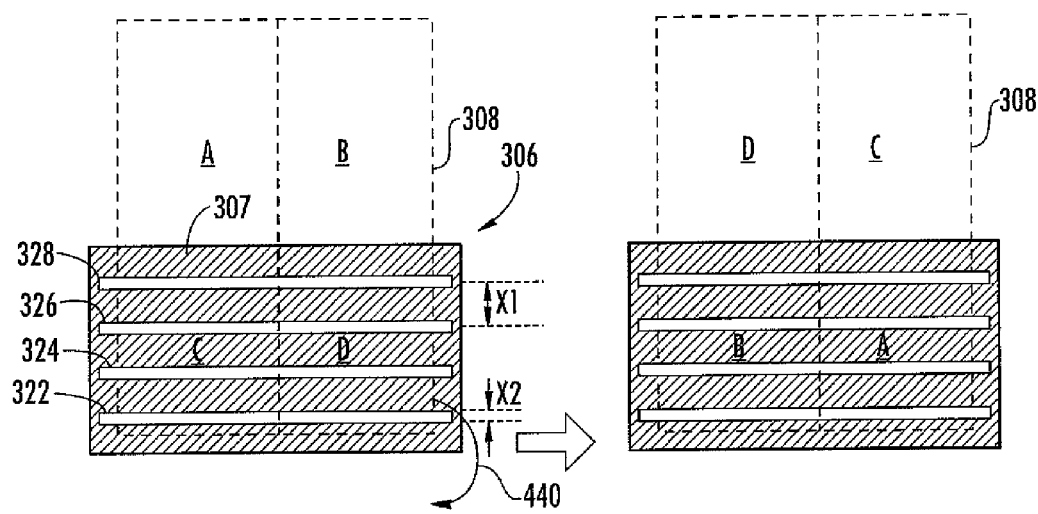
FIG. 4 is a view of the mask of FIG. 3 looking downstream in the direction of travel of ions with the target shown in phantom.

Turning to FIGS. 3 and 4, a masking apparatus 300 consistent with an embodiment of the disclosure is illustrated. The masking apparatus 300 is illustrated in a cross sectional view in FIG. 3, and in a plan view in FIG. 4 looking downstream in a direction of travel of ions 304 with the target 308 shown in phantom. In general, the masking apparatus 300 includes a mask 306 positioned upstream from a target 308. The masking apparatus 300 may be a subsystem of the beam line ion implanter of FIG. 1 and/or the plasma doping ion implanter of FIG. 2.

The mask 306 may be fabricated of graphite or another material that has a blocking portion 307 that sufficiently blocks ions 304. The mask 306 is illustrated as having four apertures 322, 324, 326, 328 for clarity of illustration. In one instance, the mask 306 may have many more apertures depending on the center to center spacing (X1) between apertures and the width (X2) of each aperture. In one embodiment, the mask 306 may have center to center spacing (X1) of about 2-3 millimeters (mm) and each aperture may be an elongated slot having a width (X2) of about 100-350 micrometers (μm) and a length of about 300 millimeters.

The target 308 may be one or more workpieces including, but not limited to, a semiconductor substrate, a solar cell, a polymer substrate, and a flat panel. The target 308 may include four separate solar cells labeled A, B, C, D in FIG. 4 and be configured in a 2 by 2 matrix. Other targets may include 6 solar cells arranged in a 2 by 3 matrix. Other combinations are also possible. The target 308 positioned downstream of the mask 306 is illustrated in phantom in FIG. 4. In operation, the mask 306 is positioned by the positioning mechanism 118 relative to the target 308 to selectively block some of the ions 304 from solar cells C and D while enabling a blanket implant to be performed on solar cells A and B unimpeded by the mask during a first time interval. The mask 306 permits ions to pass through apertures 322, 324, 326, 328 and otherwise blocks the ions. The positioning mechanism 118 then changes the relative position of the mask 306 and target 308 by rotating one with respect to the other by 180° as shown in the right hand portion of FIG. 4. In one instance, this may be accomplished by maintaining the mask 306 in a fixed position and rotating the target 308 by 180° as illustrated by arrow 440. One benefit of rotating the target 308 is that the positioning mechanism may be a rotating platen. Some existing platens are rotating platens or "roplats" equipped with this ability. Hence, modifications to the existing roplat are minimal.

Once the mask 306 and target are repositioned, a selective implant may now be performed on solar cells A and B while a blanket implant may be performed on solar cells C and D during a second time interval. As such, each solar cell A-D receives both a blanket and selective implant during successive time periods and the net result is that each solar cell A-D has a lightly doped region formed by the blanket implant and a more heavily doped region defined by the apertures 322, 324, 326, 328 of the mask 306. Whether the blanket implant is performed first (solar cells A and B) or last (solar cells C and D) the net result is the same. This is beneficial for many applications including when the solar cell is for use as a selective emitter solar cell. Furthermore, the target 308 and mask 306 may be positioned in the process chamber of the beam line implanter of FIG. 1 and/or the process chamber 202 of the plasma doping implanter of FIG. 2 and repositioned with respect to each other between the first and second time intervals without breaking an established vacuum condition.

Figure 5:
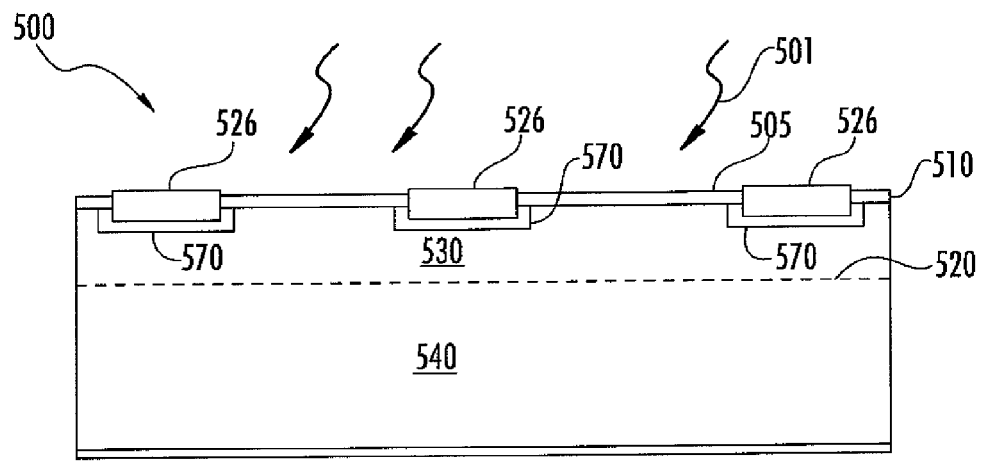
FIG. 5 is a cross sectional view of a solar cell having a selective emitter design.

Turning to FIG. 5, a cross sectional view of a selective emitter solar cell 500 that can be formed by a mask consistent with the mask 306 of FIG. 4 is illustrated having a lightly doped region 530 and more heavily doped regions 570. The lightly doped region 530 may be formed by the blanket implant while the more heavily doped regions 570 may be formed by the selective implant, e.g., through the apertures 322, 324, 326, 328 of the mask 306. The heavily doped regions 570 placed under the front side contacts 526 improve conductivity between the front side contacts 526 and the solar cell. Hence, the efficiency of the solar cell is also improved.

In operation of the selective emitter solar cell 500, photons 501 enter the solar cell 500 through the top surface 505. The photons 501 pass through an anti-reflective coating 510 designed to maximize the number of photons that penetrate the solar cell 500 and minimize those that are reflected away. The lightly doped region 530 may be an n-type region to form a p-n junction 520 between a p-type base 540 and the lightly doped n-type region 530. Those skilled in the art will recognize the p-type and n-type regions may be reversed. Photons with sufficient energy are able to free electrons from their atoms allowing them to flow through the solar cell and the front side contacts 526 to produce electricity.

Figure 6:
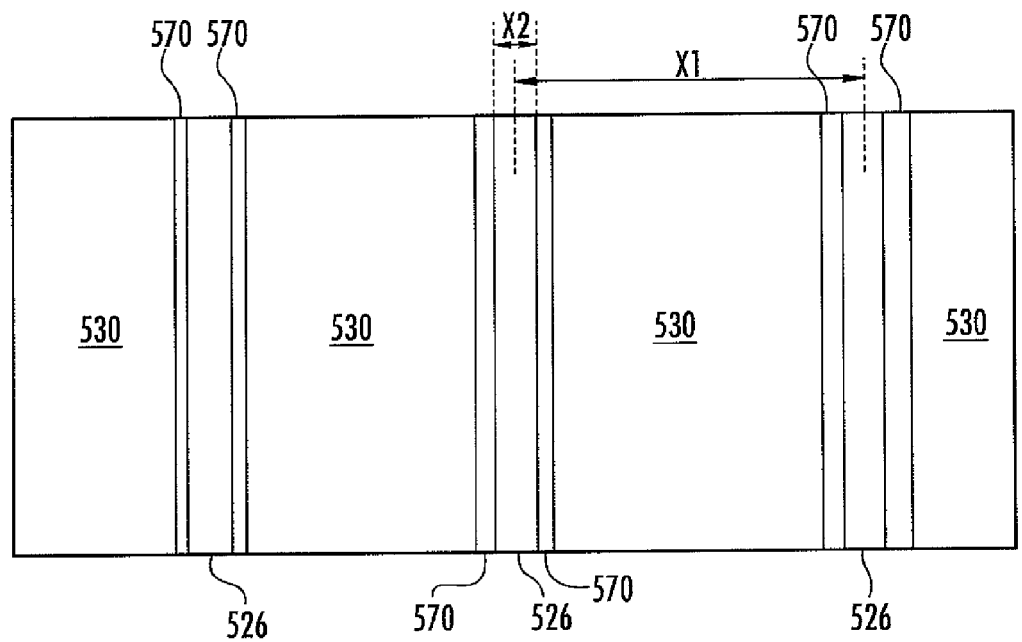
FIG. 6 is a plan view of the solar cell of FIG. 5.

FIG. 6 illustrates a top view of the selective emitter solar cell 500 of FIG. 5 showing the front side contacts 526 disposed above the heavily doped regions 570. The center to center spacing (X1) of each front side contact 526 may be about 2-3 millimeters (mm) and the width (X2) of each contact 526 may be about 100-350 p.m. The mask 306 may have apertures spaced to promote the desired spacing (X1) of the heavily doped regions 570. In addition, the apertures of the mask 306 may have a width of about 150-350 micrometers to provide a desired width of the heavily doped region 570.

Figure 7:
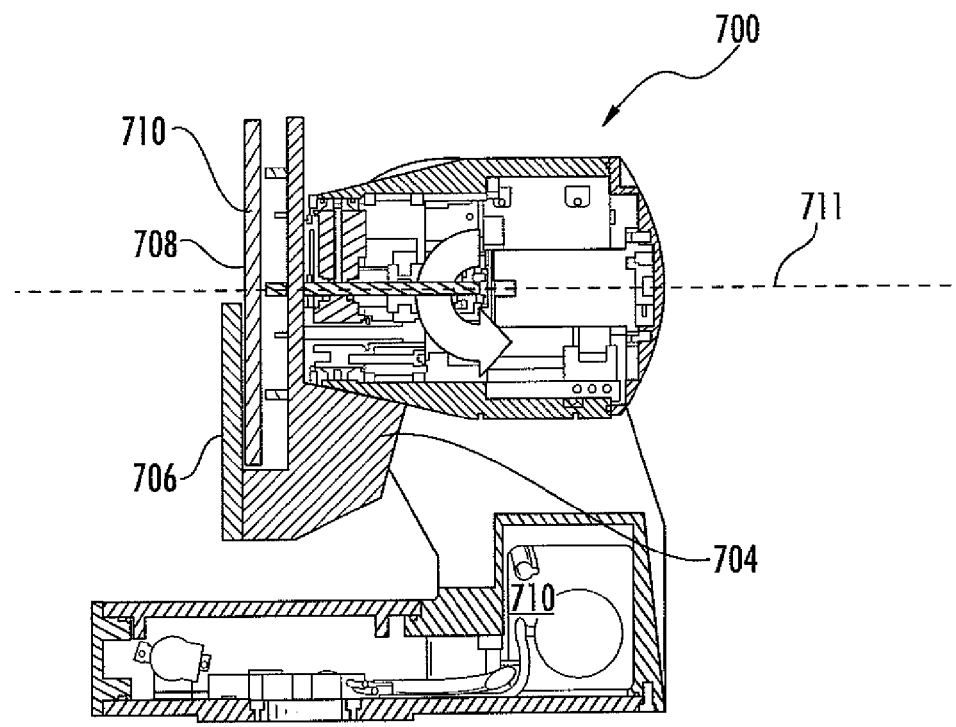
FIG. 7 is a cross sectional view of a rotating platen masking apparatus including a mask fixed to a rotating platen.
Figure 8:
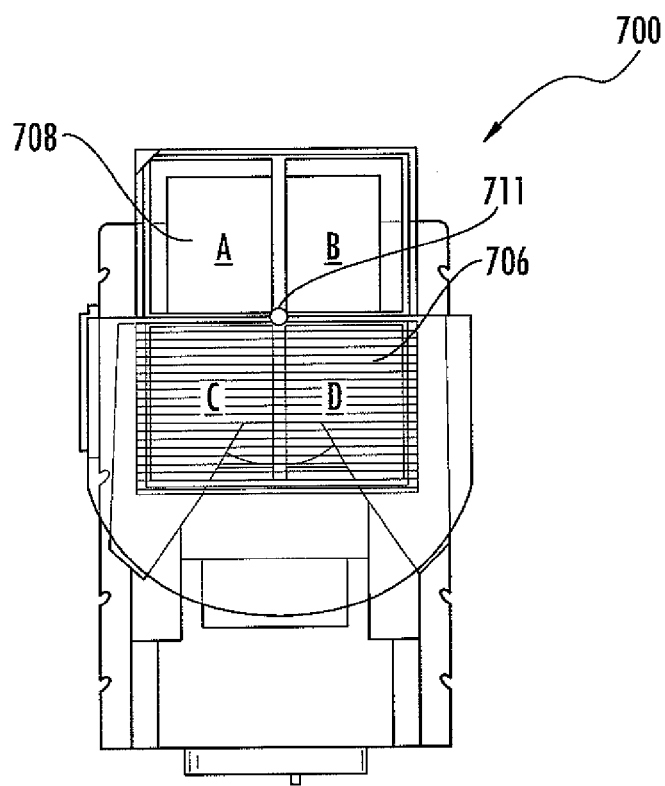
FIG. 8 is a view of the apparatus of FIG. 7 looking downstream in the direction of travel of ions.

Turning to FIGS. 7 and 8, there is illustrated a cross sectional view of a rotating platen masking apparatus 700 and a plan view of the same when viewed in a direction looking downstream in a direction of travel of ions. In this embodiment, the positioning mechanism 118 illustrated generically in FIG. 3 is the rotating platen 710 that is configured to rotate about a rotational axis 711 to rotate the target 180° between a first and second time interval. The target 708 may be a 2 by 2 solar cell matrix similar to that detailed with respect to FIG. 4. The mask 706 may include a plurality of apertures configured as elongated slots. The mask 706 may also be fixed to a static mask support arm 704 which, in turn, is also affixed to a secure portion of the rotating platen 710.

FIG. 8 is a view of the rotating platen masking apparatus 700 of FIG. 7 looking downstream in the direction of travel of ions more clearly illustrating the mask 706 and the target 708 arranged as a 2 by 2 solar cell matrix positioned downstream from the mask 706 supported by the rotating platen 710. The mask 706 and the rotating platen 710 supporting the target 708 operate to dope the same in a manner consistent with that detailed with respect to FIG. 4. That is, the rotating platen 710 may position the target 708 as illustrated in FIG. 8 such that ions directed cause the solar cells C and D to be treated with a selective implant through the apertures of the mask 706 and a blanket implant to be performed on the other half of the target 708 including the solar cells A and B during a first time interval. The rotating platen 710 may then rotate the target 708 by 180° in situ so that solar cells C and D are then exposed to a blanket implant while solar cells A and B are exposed to a selective implant through the mask 706. The net result is a lightly doped region and more heavily doped region that is useful in number of applications such as a selective emitter solar cell.

The mask 706 may float on supports and keyed features and align to the platen 710 when rotated at 0° and 180°. The keyed features may directly couple and align the mask 706 to reference features on the platen 710. In this way, accurate, reliable, and time efficient alignment of the mask 706 to the target 608 may be accomplished.

Accordingly, there is provided a masking apparatus and ion implanter having the same. The ion implanter having the masking apparatus is able to provide a two step chained ion treatment sequence for a target. A first half of the target receives a selective treatment of ions through the mask with the other half receives a blanket implant during a first time interval. Then the relative position of the mask and target is changed so opposite halves of the target are now treated with a selective and blanket implant. Hence, process time for performing chained implants is reduced to improve the throughput performance of the ion implanter. In addition, precise alignment of the mask to the target is promoted to result in better device performance for devices being formed on the target.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure is as described herein.

What is claimed is:

1. A masking apparatus comprising:
a mask positioned upstream of a target, the mask sized relative to the target to cause a first half of the target to be treated with a selective treatment of ions through the mask and a second half of the target to be treated with a blanket treatment of ions unimpeded by the mask during a first time interval; and
a positioning mechanism to change a relative position of the mask and the target so that the second half of the target is treated with the selective treatment of ions and the first half of the target is treated with the blanket implant during a second time interval.

2. The masking apparatus of claim 1, wherein the mask has a blocking portion defining a plurality of apertures, the blocking portion configured to block ions and the plurality of apertures configured to pass ions for the selective treatment of ions.

3. The masking apparatus of claim 2, wherein the plurality of apertures comprise a plurality of elongated slots spaced at equal center to center spacing less than 3 millimeters, and wherein each of the plurality of elongated slots has a length and a width, the width less than or equal to 350 micrometers.

4. The masking apparatus of claim 1, wherein the positioning mechanism comprises a rotating platen to support the target, the rotating platen configured to rotate the target 180° between the first and second time interval while the mask remains in a fixed position.

5. An ion implanter comprising:
a source of ions;
a mask positioned upstream of a target positioned for treatment with the ions, the mask sized relative to the target to cause a first half of the target to be treated with a selective treatment of the ions through the mask and a second half of the target to be treated with a blanket treatment of the ions unimpeded by the mask during a first time interval; and
a positioning mechanism to change relative positions of the mask and the target so that the second half of the target is treated with the selective treatment of ions and the first half of the target is treated with the blanket implant during a second time interval.

6. The ion implanter of claim 5, wherein the mask has a blocking portion defining a plurality of apertures, the blocking portion configured to block the ions and the plurality of apertures configured to pass the ions for the selective treatment of ions.

7. The ion implanter of claim 6, wherein the plurality of apertures comprise a plurality of elongated slots spaced at equal center to center spacing less than 3 millimeters, and wherein each of the plurality of elongated slots has a length and a width, the width less than or equal to 350 micrometers.

8. The ion implanter of claim 5, wherein the positioning mechanism comprises a rotating platen to support the target, the rotating platen configured to rotate the target 180° between the first and second time interval while the mask remains in a fixed position.

9. The ion implanter of claim 5, wherein the ion source is configured to generate an ion beam of the ions, and wherein the mask and the target are positioned in a process chamber, and wherein the target remains in the process chamber under a vacuum condition during the first time interval, the second time interval, and a time between the first and second time interval.

10. The ion implanter of claim 5, wherein the ion source comprises a plasma source configured to generate a plasma in a process chamber, the plasma comprising the ions, and wherein the mask and the target are also positioned in the process chamber, and wherein the target remains in the process chamber under a vacuum condition during the first time interval, the second time interval, and a time between the first and second time interval.

11. The ion implanter of claim 5, wherein the target comprises four solar cells configured in a 2 by 2 matrix.

12. A method comprising:
positioning a mask a distance upstream of a target;
treating a first half of the target with a selective treatment of ions through the mask and a second half of the target with a blanket treatment of ions unimpeded by the mask during a first time interval;
changing a relative position of the mask and the target; and
treating the second half of the target with the selective treatment of ions and the first half of the target with the blanket treatment of ions during a second time interval.

13. The method of claim 12, wherein the changing the relative position of the mask and the target comprises rotating the target by 180°, while the mask remains in a fixed position.

14. The method of claim 12, wherein the target comprises a selective emitter silicon solar cell, and the selective treatment of ions comprises doping the ions into elongated portions of the selective emitter silicon solar cell to form heavily doped regions having a length and a width, the heavily doped regions spaced at equal center to center spacing, and wherein front side contacts for the selective emitter solar cell are positioned above the heavily doped regions.

15. The method of claim 14, wherein the width is less than or equal to 350 micrometers and the equal center to center spacing is less than or equal to 3 millimeters.

16. The method of claim 12, wherein the target is positioned in a process chamber under a vacuum condition and the target remains in the process chamber under the vacuum condition during the first time interval, the second time interval, and a time between the first and second time interval.

17. The method of claim 12, wherein the target comprises four solar cells configured in a 2 by 2 matrix, the first half having two of the four solar cells and the second half having a remaining two of the four solar cells.

* * * * *